United States Patent
Rejman et al.

(10) Patent No.: US 8,965,738 B2
(45) Date of Patent: Feb. 24, 2015

(54) METHOD OF SELECTING A PLASTIC

(75) Inventors: Mark Rejman, Barrie (CA); Tobias Blain Hileman, New Castle, PA (US); Michael Anthony Cappelli, Wexford, PA (US); Mark Edmund Weber, Calgary (CA); Gilbert Alexander Arnould, Calgary (CA); Chris Pajak, Orland Park, IL (US); Matthew Zaki Botros, Calgary (CA)

(73) Assignee: Nova Chemicals (International) S.A., Fribourg (CH)

( * ) Notice: Subject to any disclaimer, the term of this patent is extended or adjusted under 35 U.S.C. 154(b) by 576 days.

(21) Appl. No.: 13/200,962

(22) Filed: Oct. 5, 2011

(65) Prior Publication Data

US 2013/0090892 A1   Apr. 11, 2013

(51) Int. Cl.
    *G06F 17/50*   (2006.01)
(52) U.S. Cl.
    CPC .................... *G06F 17/5018* (2013.01)
    USPC ............................................................ 703/1
(58) Field of Classification Search
    CPC .................................................. G06F 17/5018
    USPC ......................... 703/1; 700/97–98; 345/419
    See application file for complete search history.

(56) References Cited

U.S. PATENT DOCUMENTS

| | | | |
|---|---|---|---|
| 5,350,091 A | 9/1994 | Leete et al. | |
| 6,096,088 A * | 8/2000 | Yu et al. | 703/9 |
| 6,136,235 A | 10/2000 | Saito et al. | |
| 6,187,601 B1 | 2/2001 | Hu et al. | |
| 6,766,207 B2 | 7/2004 | Sato et al. | |
| 6,874,370 B1 | 4/2005 | Vachon | |
| 7,785,098 B1 * | 8/2010 | Appleby et al. | 425/470 |
| 2005/0222824 A1 * | 10/2005 | Sawai | 703/1 |
| 2007/0239411 A1 * | 10/2007 | Yamashita et al. | 703/7 |
| 2008/0300831 A1 * | 12/2008 | Taggart et al. | 703/1 |
| 2009/0259329 A1 * | 10/2009 | Patnala | 700/98 |
| 2011/0129682 A1 * | 6/2011 | Kurata et al. | 428/500 |
| 2012/0059629 A1 * | 3/2012 | Hashima et al. | 703/1 |

* cited by examiner

*Primary Examiner* — Eunhee Kim
(74) *Attorney, Agent, or Firm* — Kenneth H Johnson

(57) ABSTRACT

A plastic may be selected for a thin web application by finite element analysis of the part including the properties, including Poisson's ratio of potential polymers from which the part may be made and subjecting the computer model of the part to loads to determine the deflection of the part under a specified series of loads or when the part breaks or subjecting the part to a number of use cycles to determine when the part fails. The process is iteratively repeated for each plastic and the results are compared to select a preferred plastic for the part.

11 Claims, 1 Drawing Sheet

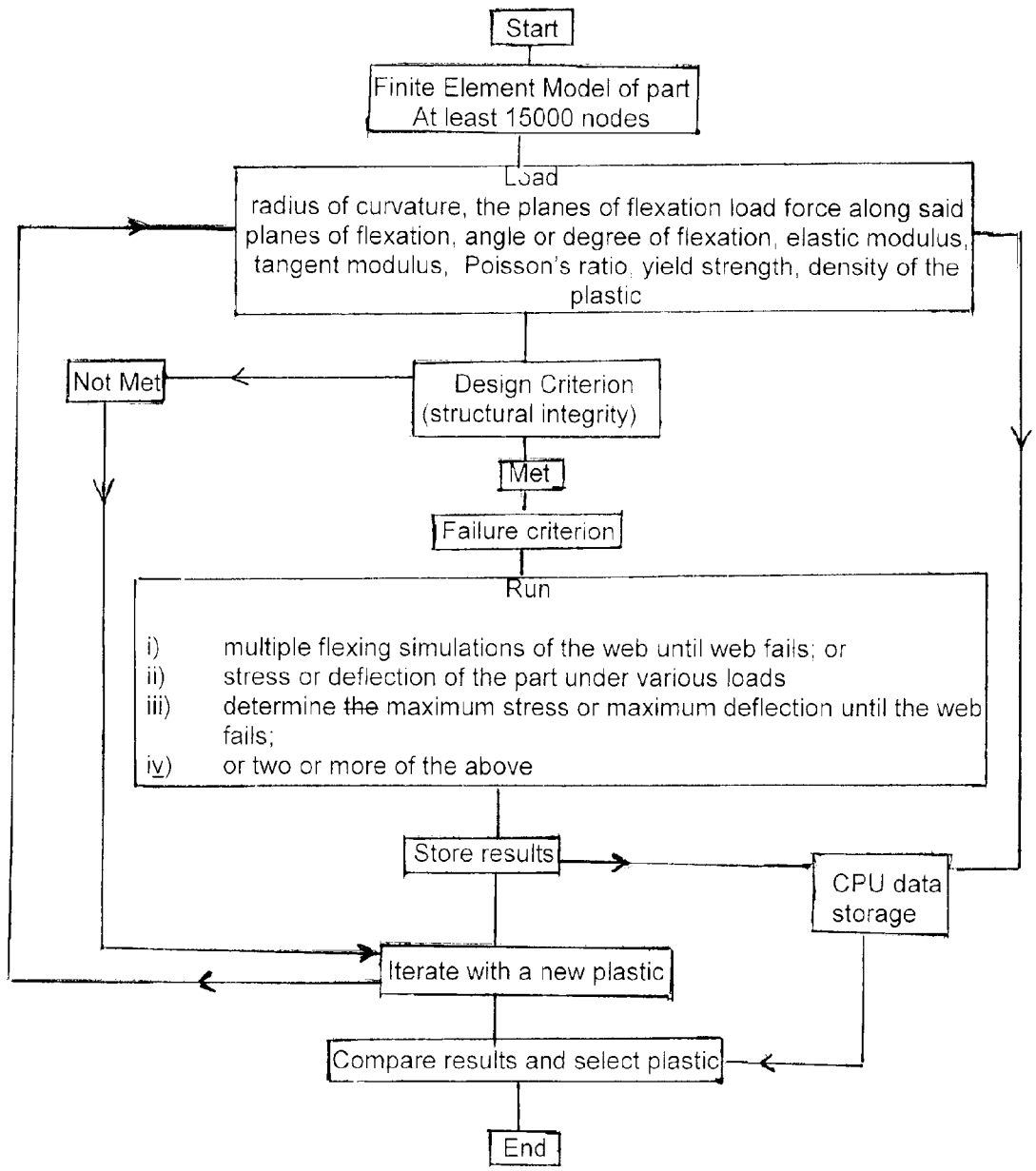

METHOD OF SELECTING A PLASTIC

FIELD OF THE INVENTION

The present invention relates to a method to select a plastic for a part. Preferably for use in a web or film used in a plastic part such as an accordion-design flexible hose, a tether, for example on a gas tank cap, and similar webs.

BACKGROUND OF THE INVENTION

Computer assisted design (CAD) and computer assisted manufacture (CAM) have been available for a significant period of time. Typically these processes are used to design a part, typically metal, and to assist in the fabrication of the part, typically through the use of numerically controlled machine tools. The specification of the material from which the part is to be manufactured is typically selected by a supervising engineer.

U.S. Pat. No. 6,766,207 issued Jul. 20, 2004 to Sato et al., assigned to Fujitsu Limited is representative of design of a "soft" mechanical part. The attributes referred to in the specification are not the physical properties of the polymer but rather the attributes of the part (e.g. shape, revision etc.). See the description of FIG. 14.

U.S. Pat. No. 6,136,235, issued Oct. 24, 2000 to Saito et al., assigned to Cannon Kabushiki Kaisha discloses a computer assisted method to determine the stresses on a plastic part when it is being molded. The patent teaches that the process is used to predict the warpage of a part, and particularly a fiber reinforced part. Based on the predictions when the part goes into manufacture if there are difficulties "quick counter measures" can be made. From the thrust of the specification the counter measures are likely to be a redesign of the part rather than selecting a different resin.

U.S. Pat. No. 6,187,601, issued Feb. 13, 2001 to Hu et al., assigned to Ford Global Technologies, Inc. discloses a method to design a plastic encapsulated power integrated circuit and a lead frame. The process includes evaluating the likelihood of peeling and shearing of the plastic from the lead substrate. The design has various radii of curvature and the issue is delamination and cracking at, or along, the radius of curvature. A finite element analysis of the design for various combinations of the plastic and lead part is conducted to determine the likelihood of cracking. This is used to select an appropriate combination of materials or to modify the design to minimize stress and select a preferred combination of materials. The parts are rigid and are not intended to flex to any significant extent during use.

U.S. Pat. No. 6,874,370, issued Apr. 5, 2005 to Vachon, teaches a method to calculate the strain and fatigue damage of a part undergoing repetitive deformation using finite element analysis and a detectable physical observation of the product under deformation. Rather than the selection of a preferred material of construction, the patent is more focused on methods of detecting deformation and then predicting cumulative strain and fatigue damage.

There are a number of patents disclosing polyolefin gasoline cans having an accordion type nozzle (e.g. U.S. Pat. No. 5,350,091 issued Sep. 27, 1994 to Leete et al.). Such nozzles are in an environment which tends to induce stress cracking and it is helpful to have some means of predicting plastics which would have useful life in the part (nozzle).

Snap lids are also used in a number of applications. While the design appears quite simple, in fact is it complex having a hinge formed from a plastic web. Again it would be useful to have a method to determine a preferred resin.

The present invention seeks to provide a computerized method to select a plastic to be used to form a non woven plastic web.

SUMMARY OF THE INVENTION

The present invention provides a method for designing a unitary polymeric structure comprising at least one integral flexible web structure having a thickness from 0.5 mm to 1 cm designed to flex about one or more planes, comprising
 1. entering a finite element model comprising not less than 15000, preferably more than 10,000, nodes of at least the web portion and anchor points and radius of curvature of the polymeric structure
 2. entering into the model from step 1 the radius of curvature of the web in use, the planes of flexation of the web, the load force along said planes of flexation, the angle or degree of flexation, the elastic modulus of the plastic, the tangent modulus of the plastic, the Poisson's ratio of the plastic, the yield strength of the plastic, and the density of the plastic to determine if the plastic meets the initial design requirements of at least the plastic web, anchor points and radius of curvature
 3. if the plastic meets the initial design criterion of at least the plastic web, anchor points and radius of curvature subjecting the model to either:
  i) multiple flexing simulations of the web until it fails; or
  ii) the stress or deflection of the part under various loads
  iii) determine the maximum stress or maximum deflection until the web fails;
  iii) or two or more of the above;
 4. storing the values from step 3;
 5) iteratively with different polymers repeating steps 1 through 4, using the same comparison in step 3
 6) comparing the stored results to select a plastic that has either a maximum number of flexes until failure or a maximum stress or deflection until failure or a minimum of deflection over a range of specified loads.

In a further embodiment the web is asymmetric.

In a further embodiment said polymer is a polyolefin.

In a further embodiment said polyolefin is selected from the group consisting of polypropylene and polymers of 80 to 100 wt % of ethylene and 0 to 20 weight % of one or more polymers selected from the group consisting of $C_{4-8}$ alpha olefins.

In a further embodiment said finite element model comprising not less than 25000, nodes.

In a further embodiment said integral polymeric structure comprises a number of pleats In a further embodiment the integral polymeric structure is a gas can nozzle.

In a further embodiment said integral polymeric structure comprises a collar to engage between bottle and a dispensing nozzle, a tether and a cap to engage and close the nozzle.

In a further embodiment said integral polymeric structure comprises a "snap" top.

BRIEF DESCRIPTION OF THE DRAWING

FIG. 1 is a flow chart outlining the process of the present invention.

DETAILED DESCRIPTION

Mechanical parts or major components of such parts are being made more frequently from plastics such as poly amides, polyesters, and increasing polyolefins. The polyolefins may be selected from the group consisting of polypropylene and polymers of 80 to 100 wt % of ethylene and 0 to 20 weight % of one or more polymers selected from the group consisting of $C_{4-8}$ alpha olefins. Some useful $C_{4-8}$ alpha olefins include 1-butene, 1-hexene and 1-octene. Unfortunately the physical properties of polyolefins may vary quite significantly. As a result the fact that one particular polyolefin may be suitable in a particular end use does not imply that all other polyolefins will also be suitable in that use.

With the increase in computer power and speed it is becoming more common to model and test parts, including plastic parts to improve their design and operation. Initially CAD/CAM was used to design and manufacture parts. More recently finite element analysis has been used to consider the component parts and sections of the component parts of a device. Typically the design for the part is programmed into a computer and the design or portions of the design are divided into a number of nodes (e.g. typically uniformly spaced grid points on the surface of the model especially where the part is thin however, they might be corners of a cube if taken at a point where a part has substantial thickness) typically not less than 15,000, preferably greater than 25,000, in some instances greater than 30,000.

In accordance with the present invention at least the web portions and ancillary attachments and anchors within the complete part are divided into nodes. The number of nodes will be a function of the size of the web and ancillary attachments and whether or not the entire structure is modeled using finite element analysis.

The nodes are then integrated for mechanical completeness (e.g. do the nodes "fit" together to form the whole structure under consideration) and do the physical properties of the structure as a whole or the part of the structure being analyzed meet the initial design specification (e.g. stiffness, elongation, yield, strain (elastic, plastic, and total), and Poisson's ratio (ratio of transverse strain to longitudinal strain) etc.) based on the integration of the properties at the nodes. It should be noted that in some instances the physical properties of the part may not be uniform. For example a "pleat or bend" may require extra toughness or stiffness for the part to function properly.

In one embodiment nodes are then moved to simulate the function of the whole part (e.g. the gas can spout is bent through a conventional arc when pouring gasoline into a lawnmower.) The stresses and strains at the node locations are then calculated and then integrated. The deformation is then removed and the part returns to its original shape and again the stresses and strain at the nodes are calculated. This is iteratively repeated until the strain or cumulative strain exceeds one or more values for the physical properties at that node (e.g. yield, brittle failure etc.) The number of cycles is recorded.

In an alternative, the model of the part is deformed (nodes are moved) to determine if or when one or more values for the physical properties at that node fails (e.g. Yield, brittle failure etc.). If there is no failure at the initial deformation the deformation is continued optionally until failure. Then the amount of deformation under a given stress or until failure is recorded. In a further embodiment the part is subject to a predetermined series of stresses (load) and the strain (deformation) at each load is recorded. In this embodiment the load need not be increase until the part fails. Rather a series of deformations at different loads for different plastics can be compared.

One, both all of the above is/are stored in the computer. Then the process is iteratively repeated using different plastics. The values are then compared to select the preferred plastic. In addition to physical properties the model may also include the price (per unit volume) of the plastic to determine one or more of the preferred cost effective plastics.

The shape of the part may be programmed into the computer from a blue print or it may be taken from a computer assisted design (CAD) program. This will provide a surface and the matrix for the undeformed part. The computer is programmed to either:

Divide the surface into a uniform grid, the intersections of the vertical and horizontal grid lines being nodes (the nodes can be taken in groups of 3 for a triangular analysis of the nodes or in groups of 4 for a rectangular analysis of the nodes); or divide the volume into uniform cells (e.g. cubes) the corners of the cubes being nodes.

"Failure" needs to be defined in the program for finite element analysis. Failure may be defined as the product not meeting initial design specifications. For example the part does not have sufficient rigidity to maintain a thread in a screw cap. This is addressed in step 2 in that the specifications for the part must be met before the program continues.

Failure after meeting design specification may be considered in a number of ways. It may be point failure. Too much force was applied in a particular area and the part failed (deforms beyond specification). This is a fairly straight-forward test. A maximum strain on the part is established (e.g. tore the snap top off the salad dressing container). Failure may also be a cumulative fatigue failure. After 5000 bends at an angle of 30° the "tape" in a tape measure breaks. Failure may also be considered in terms of the deflection of a part over a given range of specified loads.

There are a number of equations which may be used to calculate total strain life. One such equation is presented in ASTM E 606-92

$$\epsilon_{total} = \delta'_f/E(2N_f)^b + \epsilon'_f(2N_f)^c$$

in which $\epsilon_{total}$ is the total life fatigue strain;
$\delta'_f$ is the fatigue ductility coefficient;
E is Young's modulus (modulus of elasticity);
$2N_f$ is the reversals (flexes) to failure;
b is the fatigue strength coefficient;
$\epsilon'_f$ is the fatigue ductility coefficient; and
c is the fatigue ductility exponent.

The parameters for the equation for the specific polymer may be obtained by experimentation or from literature sources (closest approximation—e.g. polyethylene of a general type (low density, linear low density homogeneous polyethylene, etc.) rather than a specific grade.

There is a significant amount of prior art along the above lines, such as U.S. Pat. No. 6,874,370, but the prior art requires that the part actually be deformed under a load, or various loads, to plot the location of the nodes when the part is under a load. The present invention is distinct over the prior art in that Poisson's ratio is used in the calculations. Thus a force can be applied to the model and Poisson's ratio is used to determine the location of the nodes after deformation. Then the stresses and strains can be calculated for the deformation and the above equation can be solved for fatigue life of the part or component of the part.

Obviously the foregoing iterative process requires a significant amount of computing power or space and a significant speed of computation. Generally the computer should have a capacity of not less than 1, preferably greater than 1.5 tetra bytes and a speed of not less than about 2, preferably greater than 2.5 gigahertz (GHz)

The present invention is particularly useful to relatively thin parts (e.g. films or webs) but may also be applied to thicker parts such as tethers and "O" rings and to small parts such as caps and closures (e.g. screw caps for plastic drink bottles (whether or not carbonated).

The present invention will now be illustrated by the following example.

Commercially available software, ANSYS, was installed on a 64-bit multi-core high-performance workstation computer having a storage capacity of not less than 1 TB (terabytes) and a speed of not less than 2.5 GHz. The software was programmed with a finite element model of the part (or a web portion of the part including anchor points) and physical properties for the plastic including Poisson's ratio. The part was analyzed as described above using the maximum load analysis. A single iteration of the analysis took about 1 hour. Table 1 sets forth the resulting plastic strain for two different plastics at incrementally applied increasing pressures.

TABLE 1

| Applied Pressure, | | Plastic Strain, in/in (cm/cm) | |
|---|---|---|---|
| Psi | Pa | Material 1 | Material 2 |
| 0.01 | 0.07 | 0.00 | 0.00 |
| 0.03 | 0.21 | 0.00 | 0.00 |
| 0.04 | 0.27 | 0.00 | 0.00 |
| 0.05 | 0.34 | 0.00 | 0.00 |
| 0.07 | 0.48 | 0.00 | 0.00 |
| 0.08 | 0.54 | 0.00 | 0.01 |
| 0.10 | 0.68 | 0.01 | 0.01 |
| 0.11 | 0.75 | 0.01 | 0.02 |
| 0.12 | 0.82 | 0.02 | 0.04 |
| 0.14 | 0.95 | 0.03 | 0.05 |
| 0.15 | 1.02 | 0.04 | 0.07 |
| 0.16 | 1.09 | 0.06 | 0.09 |
| 0.18 | 1.22 | 0.07 | 0.12 |
| 0.19 | 1.29 | 0.08 | 0.14 |
| 0.20 | 1.36 | 0.10 | 0.18 |
| 0.22 | 1.5 | 0.12 | 0.20 |
| 0.23 | 1.56 | 0.13 | 0.24 |
| 0.25 | 1.7 | 0.15 | 0.28 |
| 0.26 | 1.77 | 0.17 | 0.32 |
| 0.27 | 1.84 | 0.20 | 0.36 |
| 0.29 | 2.0 | 0.21 | 0.40 |

Where plastic strain must be limited to prevent failure, it is clear from the table that the preferred plastic for this application would be material 1. The above illustrates the implementation of the present invention.

What is claimed is:

1. A method for designing a unitary plastic structure comprising at least one integral flexible web having a thickness from 0.5 mm to 1 cm designed to flex about one or more planes of flexation, anchor points for the web, and a radius of curvature comprising:
   a). entering a finite element model comprising not less than 15000 nodes, of at least the web, anchor points, and radius of curvature of the unitary plastic structure;
   b). entering into the model from step a) the radius of curvature of the web in use, the planes of flexation of the web, a load force along said planes of flexation, an angle or degree of flexation, the elastic modulus of the plastic, the tangent modulus of the plastic, the Poisson's ratio of the plastic, the yield strength of the plastic, and the density of the plastic to determine if the plastic meets the design requirements of at least the plastic web, anchor points and a radius of curvature;
   c). if the plastic meets the design criterion of at least the plastic web, anchor points and radius of curvature, defining one or more failure criterion;
   d). subjecting the model to either:
      i) multiple flexing simulations of the web until the web fails; or
      ii) stress or deflection of the structure-under various loads
      iii) determine maximum stress or maximum deflection until the web fails;
      iv) or two or more of the above;
   e). storing the failure criterion from step d);
   f). iteratively with different polymers repeating steps a) through d), using the same comparison in step d)
   g) comparing the stored failure criterion to select a plastic that has a maximum number of flexes until failure, a maximum stress or deflection until failure or a minimum of deflection over a range of specified loads.

2. The method according to claim 1, wherein said web is asymmetric.

3. The method according to claim 2, wherein said plastic is a polyolefin.

4. The method according to claim 3, wherein said polyolefin is selected from the group consisting of polypropylene and polymers of 80 to 100 weight % of ethylene and 0 to 20 weight % of one or more polymers selected from the group consisting of $C_{4-8}$ alpha olefins.

5. The method according to claim 4, wherein said finite element model comprises not less than 25000 nodes.

6. A method according to claim 5, wherein said unitary plastic structure comprises a number of pleats.

7. The method according to claim 6, wherein the unitary plastic structure is a gas can nozzle.

8. The method according to claim 5, wherein in said unitary plastic structure comprises a collar to engage between bottle and a dispensing nozzle, a tether and a cap to engage and close the nozzle.

9. The method according to claim 5, wherein said unitary plastic structure comprises a "snap" lid.

10. The method according to claim 5, wherein said unitary plastic structure comprises a screw cap for a polymeric bottle.

11. The method according to claim 5, wherein said unitary plastic structure comprises an "O" ring.

* * * * *